United States Patent
Miyao et al.

(10) Patent No.: US 10,266,964 B2
(45) Date of Patent: Apr. 23, 2019

(54) STORAGE BAG FOR POLYCRYSTALLINE SILICON INGOT, METHOD FOR PACKING POLYCRYSTALLINE SILICON INGOT, AND METHOD FOR PRODUCING CZ SILICON SINGLE CRYSTAL

(71) Applicant: Shin-Etsu Chemical Co., Ltd., Tokyo (JP)

(72) Inventors: Shuichi Miyao, Niigata (JP); Junichi Okada, Niigata (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 15/534,102

(22) PCT Filed: Dec. 4, 2015

(86) PCT No.: PCT/JP2015/006026
§ 371 (c)(1),
(2) Date: Jun. 8, 2017

(87) PCT Pub. No.: WO2016/098304
PCT Pub. Date: Jun. 23, 2016

(65) Prior Publication Data
US 2017/0342595 A1 Nov. 30, 2017

(30) Foreign Application Priority Data
Dec. 17, 2014 (JP) .................................. 2014-255604

(51) Int. Cl.
| C30B 29/06 | (2006.01) |
| B65D 81/24 | (2006.01) |
| C01B 33/02 | (2006.01) |
| C30B 15/00 | (2006.01) |

(52) U.S. Cl.
CPC ............ *C30B 29/06* (2013.01); *B65D 81/24* (2013.01); *C01B 33/02* (2013.01); *C30B 15/00* (2013.01)

(58) Field of Classification Search
CPC combination set(s) only.
See application file for complete search history.

(56) References Cited

U.S. PATENT DOCUMENTS

| 2004/0224110 | A1* | 11/2004 | Jimbo | ............... H01L 21/67303 |
| | | | | 428/35.7 |
| 2009/0056279 | A1* | 3/2009 | Sasaki | ................. B65D 31/04 |
| | | | | 53/449 |
| 2010/0154357 | A1 | 6/2010 | Wochner et al. | |
| 2014/0151259 | A1 | 6/2014 | Wochner | |

FOREIGN PATENT DOCUMENTS

| JP | 2003-191363 | * | 7/2000 | ............... B32B 7/02 |
| JP | 200696370 | A | 4/2006 | |
| JP | 2006274162 | A | 10/2006 | |
| JP | 2009298672 | A | 12/2009 | |
| JP | 2010528955 | A | 8/2010 | |
| JP | 2010195425 | A | 9/2010 | |
| JP | 2012-101838 | A | 5/2012 | |
| JP | 2014-108829 | A | 6/2014 | |
| JP | 2014162514 | A | 9/2014 | |

OTHER PUBLICATIONS

Machine translation of JP2003-191363.*
Office Action dated Jun. 27, 2017, issued in counterpart Japanese Application No. 2014-255604, with English machine translation. (8 pages).
International Search Report dated Feb. 2, 2016, issued in counterpart application No. PCT/JP2015/006026. (2 pages).

* cited by examiner

*Primary Examiner* — Erin F Bergner
(74) *Attorney, Agent, or Firm* — Westerman, Hattori, Daniels & Adrian, LLP

(57) ABSTRACT

In the present invention, as a bag to store polycrystalline silicon ingots, there is used a bag in which the concentration of paraffinic hydrocarbons in a concentrate of solvent-soluble components obtained by Soxhlet extraction using acetone as a solvent is lower than 300 ppmw as a value measured by GC-MS method; the concentration of antioxidants, lower than 10 ppmw; the concentration of ultraviolet absorbents, lower than 5 ppmw; and the concentration of antistatic agents and surfactants, lower than 50 ppmw. Then, when the polycrystalline silicon ingots are packed, preferably, the polycrystalline silicon ingots are put in the storage bag; thereafter, the storage bag is sealed; further, the storage bag is put and sealed in a linear low-density polyethylene bag containing an antistatic agent or a surfactant added in the bag material.

4 Claims, No Drawings

STORAGE BAG FOR POLYCRYSTALLINE SILICON INGOT, METHOD FOR PACKING POLYCRYSTALLINE SILICON INGOT, AND METHOD FOR PRODUCING CZ SILICON SINGLE CRYSTAL

TECHNICAL FIELD

The present invention relates to a storing and packing technology of a polycrystalline silicon ingot to be used as a raw material for production of CZ silicon single crystal.

BACKGROUND ART

Although polycrystalline silicon ingots are obtained by crushing polycrystalline silicon rods synthesized by a Siemens method or the like, since the polycrystalline silicon ingots as a raw material for production of CZ silicon single crystal are demanded to have high surface cleanliness, the polycrystalline silicon ingots are, after the crushing, subjected to chemical etching using nitro-fluoric acid or the like, for the purpose of removal of contaminants adhered on the surface, and after being cleaned with chemicals, subjected to a contamination inspection of the surface and the size classification, and packed as products. For example, Patent Literature 1 (Japanese Patent Laid-Open No. 2009-298672) proposes that as a technology of simply and securely preventing the unusual oxidation phenomenon called stains generated on the surface of crushed ingots of polycrystalline silicon during storage of the bagged crushed ingots, the crushed ingots of polycrystalline silicon are treated with a cleaning solution containing fluorine, washed with water, dried, and thereafter held at a temperature of 45° C. or higher for 20 min or longer in circulation of an inert gas whose dew point is −35° C. to −20° C. under reduced pressure.

Also until now, with respect to packing, in order not to contaminate the surface of polycrystalline silicon ingots, there have been made studies on materials for bags and the like to be used for packing; and due to recent year's improvements of analytical technologies, there has gradually been clarified the relationship between the level of the surface contamination of the polycrystalline silicon ingots and the production yield of CZ silicon single crystal.

Since bags for storing polycrystalline silicon ingots are required to be capable of maintaining cleanliness of the surface of the polycrystalline silicon ingots to be stored, materials for having a strength and an elongability in degrees not causing the bags to be broken, torn or otherwise by the polycrystalline silicon ingots having sharp irregularities on their surfaces are used, and linear low-density polyethylenes and the like are generally said to be preferable.

The linear low-density polyethylene (LLDPE) is produced, for example, by an ionic polymerization method, and the polymerization catalyst used at the time includes Ti-based, Cr-based, Zr-based catalysts and the like. From the viewpoint that the LLDPEs are those capable of maintaining cleanliness of the surface of the polycrystalline silicon ingots to be stored, the distribution of the composition and the molecular weight distribution of the LLDPE become important. Further in LLDPE, particularly, the intermolecular distribution of the comonomer concentration largely varies depending on the characteristics of the catalyst; the tensile strength, the heat sealability, hexane-soluble components and the like change; and the elution of low-molecular components are observed in some cases. Further in LLDPE, an antioxidant, an ultraviolet absorbent, a light stabilizer and an antistatic agent are used as additives, and their concentration ranges vary depending on the products.

Although these additives are expected to have not a little influence on the surface cleanliness of polycrystalline silicon ingots stored in a LLDPE bag, the degree of the influence has not been clarified so far.

CITATION LIST

Patent Literature

Patent Literature 1: Japanese Patent Laid-Open No. 2009-298672

SUMMARY OF INVENTION

Technical Problem

Various types of additives are blended in LLDPE in order to prevent the deterioration and oxidation of the polymer as a main component. Although these components raise no problem in usual applications, since LLDPE is demanded to be of a high purity in semiconductor applications, not only the decomposition and elution of the polymer as a main component, but also the elution of the additives raises a big problem.

As described above, in nowadays when due to recent year's improvements of analytical technologies, the relationship between the level of the surface contamination of the polycrystalline silicon ingots and the production yield of CZ silicon single crystal has gradually been clarified, it has a remarkably important significance to know what sort of a linear low-density polyethylene bag is suitable as a bag to store polycrystalline silicon ingots.

The present invention has been achieved in consideration of the above problem, and has an object to provide a linear low-density polyethylene bag capable of storing polycrystalline silicon ingots while maintaining cleanliness of the surface of the polycrystalline silicon ingots provided as a raw material of single crystal for CZ, and to thereby suppress the incorporation of carbon impurities from the raw material into the CZ silicon single crystal grown by using the polycrystalline silicon ingots as the raw material.

Solution to Problem

In order to solve the above-mentioned problem, the linear low-density polyethylene bag for storing polycrystalline silicon ingots according to the present invention is characterized in that the concentration of paraffinic hydrocarbons in a concentrate obtained by Soxhlet extraction using acetone as a solvent is lower than 300 ppmw as a value measured by a GC-MS method, Preferably, further the concentration of antioxidants in a concentrate obtained by Soxhlet extraction using acetone as a solvent is lower than 10 ppmw as a value measured by a GC-MS method.

Preferably, further the concentration of ultraviolet absorbents in a concentrate obtained by Soxhlet extraction using acetone as a solvent is lower than 5 ppmw as a value measured by a GC-MS method.

Preferably, further the total concentration of antistatic agents and surfactants in a concentrate obtained by Soxhlet extraction using acetone as a solvent is lower than 50 ppmw as a value measured by a GC-MS method.

The method for packing polycrystalline silicon ingots according to the present invention comprises putting polycrystalline silicon ingots in the storage bag according to the present invention, thereafter sealing the storage bag, putting the storage bag in a linear low-density polyethylene bag containing an antistatic agent or a surfactant added in the bag material, and sealing the bag.

In the method for producing CZ silicon single crystal according to the present invention, there are used, as a raw material of the CZ single crystal, polycrystalline silicon ingots having been put and stored in the above-mentioned storage bag and having a total concentration of surface organic substances of lower than 4 ppbw as a value measured by a GC-MS method.

Further in the method for producing CZ silicon single crystal according to the present invention, the polycrystalline silicon ingots packed by the above-mentioned method are used as a raw material of the single crystal for CZ.

Advantageous Effects of Invention

According to the present invention, it has been clarified what sort of a polyethylene bag is suitable for storing polycrystalline silicon ingots provided as a raw material of single crystal for CZ while maintaining cleanliness of the surface of the polycrystalline silicon ingots.

Then, by use of such a polyethylene bag, there can be suppressed the incorporation of carbon impurities from the raw material into the CZ silicon single crystal.

DESCRIPTION OF EMBODIMENTS

It is demanded that a storage bag for polycrystalline silicon ingots provided as a raw material of single crystal for CZ be one not contaminating the surface of the polycrystalline silicon ingots put and stored therein. Therefore, it becomes necessary that basically, the bag material contain no additives and have no observed elution of low-molecular components of LLDPE itself; however, it has not been clarified what degree of the content of the additives is acceptable and what degree of the elution of the low-molecular components of LLDPE is acceptable.

Then, the present inventors have clarified by the following studies what sort of a polyethylene bag is suitable to store polycrystalline silicon ingots provided as a raw material of single crystal for CZ while maintaining cleanliness of the surface of the polycrystalline silicon ingots.

[Condition for Evaluating Amounts of Organic Components Eluted from a LLDPE Bag]

Various types of bags (A to G) were prepared from commercially available LLDPE bags; a LLDPE sheet of 1 g was cut out as a specimen from these bags each; and the specimen of 1 g was subjected to Soxhlet extraction using acetone as a solvent for 8 hours. An obtained extract (a concentrate of solvent-soluble components) was subjected to a GC-MS analysis (quadruple mass analysis) to thereby measure elution amounts of additives and low-molecular components eluted.

The apparatus used for the measurement was 8400 GC/320 MS, manufactured by Varian, Inc., and the separation column was HP-5 MS (0.25 mm in diameter×30 m×0.25 μm in membrane thickness). The column was held at 60° C. for 1 min, thereafter heated at 10° C./min, and held at 300° C. for 25 min. The carrier gas in the measurement was He; and the condition was set so that the amount of the extract injected was 1 μl and the split ratio was 10:1. The mass analysis was carried out by an electron impact ionization method, and the scanning range was m/z=40 to 700.

The amounts of organic substances (paraffinic hydrocarbons, antioxidants, ultraviolet absorbents, and antistatic agents and surfactants) eluted from the each bag and detected are collectively shown in Table 1. Here, in the calculation of the concentrations, for the organic substances excluding the paraffinic hydrocarbons, known-concentration reference specimens were used. For the paraffinic hydrocarbons, known-concentration reference specimens of decane were used and the concentration was calculated from the a real value of all peaks.

TABLE 1

| Storage Bag | Paraffinic Hydrocarbon | Antioxidant | Ultraviolet Absorbent | Antistatic Agent Surfactant |
|---|---|---|---|---|
| A | 1100 | 300 | 10 | <50 |
| B | 1200 | <10 | <5 | <50 |
| C | <300 | <10 | <5 | <50 |
| D | <300 | <10 | <5 | <50 |
| E | 500 | <10 | <5 | 500 |
| F | 400 | <10 | <5 | <50 |
| G | <300 | <10 | <5 | <50 |

[Unit: ppmw]

The paraffinic hydrocarbons were detected, in chromatography of GC-MS, over the molecular weight region from low molecular to oligomeric, and as a result of an MS qualitative determination, were linear and branched paraffinic hydrocarbons.

The antioxidant was, as a result of an MS qualitative determination, di-t-butyl-4-ethylphenol.

As the ultraviolet absorbent, Irganox 1076, distributed as a commodity, was detected.

As the antistatic agent or the surfactant, hexadecanol was detected.

[Evaluation of Organic Substances Adhered on the Surface of the Polycrystalline Silicon Ingots]

The polycrystalline silicon ingots are etched with a mixed acid of hydrofluoric acid and nitric acid; the polycrystalline silicon ingots of 5.0 kg were filled in the each bag (A to G), which were then sealed by heat sealing. Further, the bag was packed in a corrugated board, transported in Japan domestically, and unpacked after one year; and components adsorbed on the surface of the nuggets, that is, contaminating components, were qualitatively and quantitatively analyzed.

A specimen for analysis of 5 g (mostly, 20 to 30 mm in major diameter, 5 to 10 mm in minor diameter) was sampled, and heated at 250° C. for 10 min in an environment of He gas flowing (1 ml/min) to thereby make organic components adhered on the surface to be desorbed and make the organic components to be adsorbed on an adsorbent (Glass Wool f255). The adsorbent was instantaneously heated and the adsorbed components were again subjected to a GC-MS analysis (quadruple mass analysis). Here, the released components were made to be adsorbed on the adsorbent at −60° C. (liquid nitrogen); and the desorption of the adsorbed components from the adsorbent was carried out by heating the adsorbent from −60° C. to 250° C./25 sec.

The apparatus used for the measurement was 5975C-inert XL-MSD, manufactured by Agilent Technologies, Inc., and the separation column was Ultra2 (25 m×0.2 mm in diameter, 0.33 μm in membrane thickness), manufactured by Agilent Technologies, Inc. The column was held at 50° C. for 5 min, and thereafter heated at 10° C./min up to 300° C. The carrier gas in the measurement was He (flow volume: 1 ml/min), and the condition was set so that the column inlet port temperature was 300° C. and the split ratio was 20:1. The mass analysis mode was set to be an electron impact ionization mode.

The components thus detected were components detected as eluted components by the above-mentioned acetone extraction; and it was confirmed that components whose detected amounts were small in the acetone extraction had a tendency of being present in small amounts also as organic substances adhered on the surface of the polycrystalline silicon ingots.

The amounts of organic substances (paraffinic hydrocarbons, antioxidants, ultraviolet absorbents, and antistatic agents and surfactants) detected are collectively shown in Table 2. The quantitative determination was carried out by using n-tetradecane as a reference substance. Here, in the measurement result in the experiment using the bag E, $CH_3(CH_2)_{16}CH_2OH$ (stearyl alcohol) was clearly detected. $CH_3(CH_2)_{16}CH_2OH$ (stearyl alcohol) was a component which was not detected as an eluted organic substance from the bag E; and the reason was unknown, but was presumed to be due to the decomposition by the acetone extraction and heating.

TABLE 2

| Storage Bag | Paraffinic Hydrocarbon | Antioxidant | Ultraviolet Absorbent | Antistatic Agent Surfactant |
|---|---|---|---|---|
| A | 24 | 5 | <0.1 | <0.1 |
| B | 17 | <0.1 | <0.1 | <0.1 |
| C | 4 | <0.1 | <0.1 | <0.1 |
| D | 3 | <0.1 | <0.1 | <0.1 |
| E | 6 | <0.1 | <0.1 | 2 |
| F | 5 | <0.1 | <0.1 | <0.1 |
| G | 3 | <0.1 | <0.1 | <0.1 |

[Unit: ppmw]

From the results shown in Table 2, it can be read that a bag in which eluted amounts of low-molecular components or additives in the bag material is large has a tendency of bringing about larger adhered amounts thereof on the surface of the polycrystalline silicon ingots.

[Checking of the Influence on the Carbon Concentration in CZ Silicon Single Crystal]

CZ silicon single crystal was grown by using as a raw material the polycrystalline silicon ingots prepared for the above-mentioned "Evaluation of organic substances adhered on the surface of the polycrystalline silicon ingots", and the carbon concentration in the bulk was examined. Here, the carbon concentration was quantitatively determined by an FT-IR according to the procedure of ASTM F1391-93 (reapproved 2000). The measurement results are collectively shown in Table 3.

Here, when storage bags are unpacked to take out the polycrystalline silicon ingots, the work is carried out in a clean room, but at this time, static electricity by friction or the like is generated and not a few particles are generated. Hence, it is preferable that the unpacking work be carried out in the state where the polycrystalline silicon ingots are stored in bags containing an antistatic agent and a surfactant added in the bag materials. Then, in any Experimental Examples, the unpacking work was carried out in the state where the polycrystalline silicon ingots are stored in the bag E used in Comparative Example 3.

In order to more simplify such unpacking work, it is preferable that in packing, there be carried out double packing in which a bag containing the polycrystalline silicon ingots put therein and having been sealed is further put in a linear low-density polyethylene bag containing an antistatic agent or a surfactant added in the bag material, and the latter bag is sealed.

TABLE 3

| Experimental Example | Bag | Polycrystalline Si Chunk Surface Organic Substance Amount [ppbw] | Polycrystalline Si Chunk Carbon Amount in Bulk [ppba] | CZ-Si Carbon Amount in Single Crystal [ppbw] | [ppba] |
|---|---|---|---|---|---|
| Comparative Example 1 | A | 29 | <21 | 33 | 80 |
| Comparative Example 2 | B | 17 | <21 | 25 | 60 |
| Example 1 | C | 4 | <21 | <21 | <50 |
| Example 2 | D | 3 | <21 | <21 | <50 |
| Comparative Example 3 | E | 8 | <21 | 25 | 60 |
| Comparative Example 4 | F | 5 | <21 | 21 | 50 |
| Example 3 | G | 3 | <21 | <21 | <50 |

From the results, in order to reduce the carbon concentration in the CZ silicon single crystal, it is natural that the carbon concentration in bulks of the polycrystalline silicon ingots is needed to be reduced, but it is understandable that the concentration of the organic substances adhered on the raw material surface is simultaneously needed to be reduced. Then, it is preferable that polycrystalline silicon ingots having a total of the concentrations of surface organic substances of lower than 4 ppbw be used as a raw material for growing CZ silicon single crystal.

Specifically, it is preferable that the concentration of paraffinic hydrocarbons in a concentrate of solvent-soluble components obtained by Soxhlet extraction using acetone as a solvent be lower than 300 ppmw as a value measured by a GC-MS method.

Additionally, it is preferable that the concentration of antioxidants in the concentrate of the solvent-soluble components obtained by the Soxhlet extraction using acetone as a solvent be lower than 10 ppmw as a value measured by the GC-MS method.

Additionally, it is preferable that the concentration of ultraviolet adsorbents in the concentrate of the solvent-soluble components obtained by the Soxhlet extraction using acetone as a solvent be lower than 5 ppmw as a value measured by the GC-MS method.

Additionally, it is preferable that the total concentration of antistatic agents and surfactants in the concentrate of the solvent-soluble components obtained by the Soxhlet extraction using acetone as a solvent be lower than 50 ppmw as a value measured by the GC-MS method.

Then, when the polycrystalline silicon ingots are packed, it is preferable that the polycrystalline silicon ingots be put in the above-mentioned storage bag; thereafter, the storage bag be sealed; further, the storage bag be put in a linear low-density polyethylene bag containing an antistatic agent or a surfactant added in the bag material; and the bag be sealed.

In the method for producing CZ silicon single crystal according to the present invention, there is used, as a raw material of the single crystal for CZ, polycrystalline silicon ingots having been put and stored in the above-mentioned storage bag and having a total concentration of surface organic substances of lower than 4 ppbw as a value measured by the GC-MS method.

Further, in the method for producing CZ silicon single crystal according to the present invention, the polycrystalline silicon ingots packed by the above-mentioned method are used as a raw material of the single crystal for CZ.

INDUSTRIAL APPLICABILITY

According to the present invention, it has been clarified what sort of a polyethylene bag is suitable to store polycrystalline silicon ingots provided as a raw material of single crystal for CZ while maintaining cleanliness of the surface of the polycrystalline silicon ingots. By use of such a polyethylene bag, there can be suppressed the incorporation of carbon impurities from the raw material to the CZ silicon single crystal.

The invention claimed is:

1. A method for packing a polycrystalline silicon ingot, comprising: putting the polycrystalline silicon ingot in a first storage bag; thereafter sealing the first storage bag; further putting the first storage bag in a second storage bag; and sealing the second storage bag, wherein the first storage bag is composed of a first bag material comprising a linear low-density polyethylene, wherein the second storage bag is composed of a second bag material comprising a linear low-density polyethylene and at least one of an antistatic agent and a surfactant, and wherein a concentration of paraffinic hydrocarbons eluted from the first storage bag is lower than 300 ppmw, as measured by subjecting a sheet of 1 g cut-out as a specimen of the first storage bag to the Soxhlet extraction using acetone as the solvent for 8 hours.

2. A method for producing Czochralski (CZ) silicon single crystal, comprising: performing a Czochralski (CZ) single crystal growth process using a polycrystalline silicon ingot put and stored in a first storage bag as a raw material, wherein the first storage bag is composed of a first bag material comprising a linear low-density polyethylene, wherein a concentration of paraffinic hydrocarbons eluted from the first storage bag is lower than 300 ppmw, as determined by obtaining a concentrate by Soxhlet extraction using acetone as a solvent and then measuring the concentration by a gas chromatography-mass spectrometry (GC-MS) method, and wherein a total concentration of organic substances eluted from the first storage bag onto a surface of the polycrystalline silicon ingot is lower than 4 ppbw, as measured by a gas chromatograph-mass spectrometry (GC-MS) method.

3. A method for producing (CZ) silicon single crystal, comprising:
performing a Czochralski (CZ) single crystal growth process using a polycrystalline silicon ingot packed by a method according to claim 1 as a raw material.

4. The method according to claim 1,
wherein the first bag material further comprises at least one additive selected from the group consisting of an antioxidant, an ultraviolet absorbent, an antistatic agent, and a surfactant, and
wherein when the first bag material contains the antioxidant, a concentration of the antioxidant eluted from the first storage bag is lower than 10 ppmw, as determined by obtaining a concentrate by Soxhlet extraction using acetone as a solvent and then measuring the concentration by the gas chromatography-mass spectrometry (GC-MS) method.

* * * * *